(12) United States Patent
Lin et al.

(10) Patent No.: US 9,806,032 B1
(45) Date of Patent: Oct. 31, 2017

(54) INTEGRATED CIRCUIT STRUCTURE WITH REFRACTORY METAL ALIGNMENT MARKER AND METHODS OF FORMING SAME

(71) Applicant: GLOBALFOUNDRIES Inc., Grand Cayman (KY)

(72) Inventors: Wei Lin, Singapore (SG); Nailong He, Wuxi (CN); Upinder Singh, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/384,741

(22) Filed: Dec. 20, 2016

(51) Int. Cl.
| | | |
|---|---|---|
| H01L 23/544 | (2006.01) | |
| H01L 49/02 | (2006.01) | |
| H01L 23/522 | (2006.01) | |
| H01L 27/06 | (2006.01) | |

(52) U.S. Cl.
CPC ........ *H01L 23/544* (2013.01); *H01L 23/5223* (2013.01); *H01L 23/5228* (2013.01); *H01L 27/0682* (2013.01); *H01L 28/75* (2013.01); *H01L 2223/54426* (2013.01)

(58) Field of Classification Search
None
See application file for complete search history.

(56) References Cited

U.S. PATENT DOCUMENTS

| | | | | |
|---|---|---|---|---|
| 6,750,115 | B1* | 6/2004 | Ning | H01L 23/544 |
| | | | | 257/E21.008 |
| 8,017,490 | B2* | 9/2011 | Kim | H01L 23/5223 |
| | | | | 257/E21.008 |
| 9,000,562 | B2* | 4/2015 | Horng | H01L 23/5223 |
| | | | | 257/296 |
| 9,026,977 | B2 | 5/2015 | Tarabbia et al. | |
| 9,373,680 | B1* | 6/2016 | Lee | H01L 23/5223 |
| 2006/0189069 | A1* | 8/2006 | Coolbaugh | H01L 21/76808 |
| | | | | 438/243 |
| 2009/0200638 | A1* | 8/2009 | Smith | H01L 21/76816 |
| | | | | 257/532 |
| 2010/0129978 | A1* | 5/2010 | Kim | H01L 28/91 |
| | | | | 438/393 |

(Continued)

*Primary Examiner* — Benjamin Sandvik
(74) *Attorney, Agent, or Firm* — Anthony Canale; Hoffman Warnick LLC

(57) ABSTRACT

The disclosure relates to integrated circuit (IC) structures and fabrication techniques. Methods according to the disclosure can include: providing a precursor structure including: a first inter-metal dielectric (IMD); a barrier dielectric positioned on the first IMD; forming an insulator on the barrier dielectric of the precursor structure, wherein an upper surface of the insulator includes a first trench and a second trench laterally separated from the first trench; forming an alignment marker over the precursor structure by filling the first trench with a first refractory metal film; forming a first metal-insulator-metal (MIM) electrode by filling the second trench with the first refractory metal film; recessing the insulator without exposing an upper surface of the barrier dielectric; forming a MIM dielectric layer on the insulator; and forming a second MIM electrode on the MIM dielectric layer, such that the second MIM electrode overlies a portion of the first MIM electrode.

15 Claims, 4 Drawing Sheets

(56) References Cited

U.S. PATENT DOCUMENTS

| | | | | |
|---|---|---|---|---|
| 2012/0211866 A1* | 8/2012 | Chao | ................... | H01L 23/5223 257/532 |
| 2012/0309164 A1* | 12/2012 | Ohkawa | .............. | H01L 21/7687 438/396 |
| 2013/0109177 A1* | 5/2013 | Watanabe | ........... | H01L 23/5223 438/675 |

\* cited by examiner

INTEGRATED CIRCUIT STRUCTURE WITH REFRACTORY METAL ALIGNMENT MARKER AND METHODS OF FORMING SAME

BACKGROUND

Technical Field

The present disclosure relates to integrated circuit (IC) structures with a refractory metal alignment marker formed along with other components, e.g., metal-insulator-metal (MIM) capacitors and/or resistors. Embodiments of the present disclosure include methods of forming an IC structure to reduce the number of masks and precursor materials needed to form an alignment marker with other IC components.

Related Art

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to forming a first "metal level," i.e., a metal wire for connecting several semiconductor devices together. In the case of a transistor, a group of vertically-extending conductive contacts can provide electrical connections to the transistor from other functional elements of a circuit. BEOL generally includes fabrication processes following the formation of the first metal level, including the formation of all subsequent metal levels. Each metal level can include metal wires therein, which can be connected to other metal levels through vertically-oriented conducting wires known as vias. In conventional BEOL processing, a layer of vias is formed to connect devices in an IC structure to a layer of metal wires formed on top of the vias, with a successive layer of vias formed thereon, followed by another layer of metal wires, etc. To provide greater scaling and sophistication of the fabricated device, the number of metal levels can be varied to suit a particular application, e.g., by providing four to six metal levels, or as many as, in a further example, sixteen or more metal levels.

Examples of electrically connected components within an IC may include, e.g., transistors, resistors, capacitors, diodes, etc. As the size and separation between components in an IC continues to decrease, the design of such components has evolved over time. One paradigm of forming capacitors, diodes, and/or other components includes the formation of metal-insulator-metal (MIM) components. MIM components may be associated with distinct processing challenges, e.g., the use of non-transparent materials which may affect further processing and fabrication of a device by photolithography. In conventional processing of MIM components, a preliminary masking layer may be formed to include one or more alignment features for targeting the position of later-fabricated components relative to underlying layers. Forming a preliminary masking layer is conventionally associated with additional forming (e.g., deposition) and removing (e.g., etching, planarizing, etc.) processes which may increase the cost of forming an IC, and/or introduce further operational concerns.

SUMMARY

A first aspect of the disclosure provides a method of forming an integrated circuit (IC) structure, the method including: providing a precursor structure including: a first inter-metal dielectric (IMD); a barrier dielectric positioned on the first IMD; forming an insulator on the barrier dielectric of the precursor structure, wherein an upper surface of the insulator includes a first trench and a second trench laterally separated from the first trench; forming an alignment marker over the precursor structure by filling the first trench with a first refractory metal film; forming a first metal-insulator-metal (MIM) electrode by filling the second trench with the first refractory metal film; recessing the insulator without exposing an upper surface of the barrier dielectric; forming a MIM dielectric layer on the insulator; and forming a second MIM electrode on the MIM dielectric layer, such that the second MIM electrode overlies a portion of the first MIM electrode.

A second aspect of the disclosure provides a method of forming an integrated circuit (IC) structure, the method including: providing a precursor structure including: a first inter-metal dielectric (IMD), a barrier dielectric positioned on the first IMD; forming an insulator on the barrier dielectric of the precursor structure, wherein an upper surface of the insulator includes a first trench, a second trench laterally separated from the first trench, and a third trench laterally separated from the first and second trenches, wherein the second trench is positioned laterally between the first and third trenches; forming a first refractory metal film on the insulator and within each of the first trench, the second trench, and the third trench; planarizing the first refractory metal film to expose an upper surface of the insulator, such that a remainder of the first refractory metal film forms an alignment marker within the first trench, a first metal-insulator-metal (MIM) electrode within the second trench, and a resistor wire within the third trench; recessing the insulator without exposing an upper surface of the barrier dielectric; forming a MIM dielectric layer on the insulator; and forming a second MIM electrode on the MIM dielectric layer, such that the second MIM electrode overlies a portion of the first MIM electrode.

A third aspect of the disclosure provides an integrated circuit (IC) structure including: a first inter-metal dielectric (IMD); a barrier dielectric positioned on the first IMD; an insulator positioned on the barrier dielectric, wherein an upper surface of the insulator includes a first trench, and a second trench laterally separated from the first trench; an alignment marker positioned within the first trench, wherein the alignment marker includes a refractory metal; a first metal-insulator-metal (MIM) electrode positioned within the second trench; a MIM dielectric layer positioned on the alignment marker, the first MIM electrode, and an upper surface of the insulator; and a second MIM electrode positioned on the MIM dielectric and overlying only a portion of the first MIM electrode, wherein the first MIM electrode, the MIM dielectric layer, and the second MIM electrode define a MIM capacitor structure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

The disclosure relates to integrated circuit (IC) structures and fabrication techniques. Methods according to the disclosure can include: providing a precursor structure including: a first inter-metal dielectric (IMD); a barrier dielectric positioned on the first IMD; forming an insulator on the barrier dielectric of the precursor structure, wherein an upper surface of the insulator includes a first trench and a second trench laterally separated from the first trench; forming an alignment marker over the precursor structure by filling the first trench with a first refractory metal film; forming a first metal-insulator-metal (MIM) electrode by filling the second trench with the first refractory metal film; recessing the insulator without exposing an upper surface of the barrier dielectric; forming a MIM dielectric layer on the insulator; and forming a second MIM electrode on the MIM dielectric layer, such that the second MIM electrode overlies a portion of the first MIM electrode. The present disclosure further includes alternative IC structures and fabrication techniques, examples of which are set forth herein.

Figure 1:
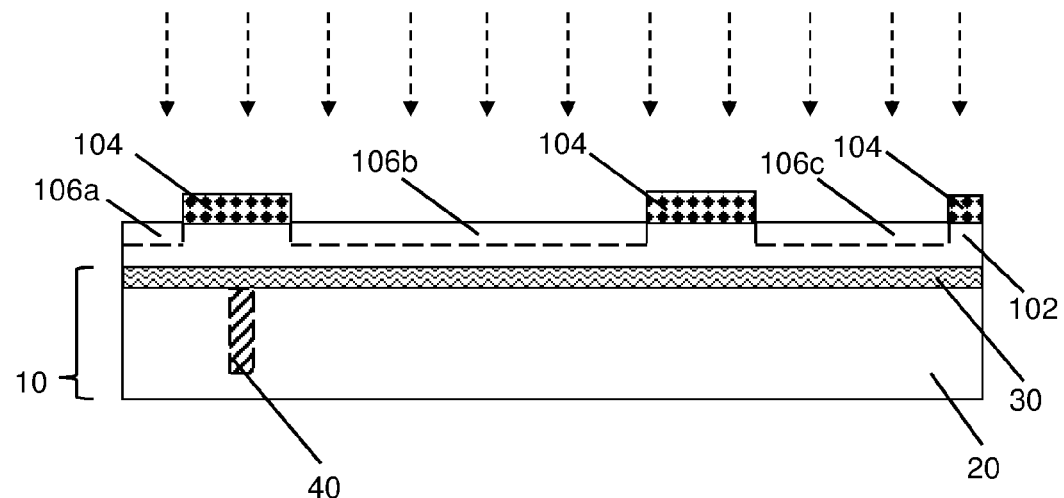
FIG. 1 shows a cross-sectional view of a preliminary structure and processes of a method according to embodiments of the disclosure.

Referring to FIG. 1, embodiments of the present disclosure include providing a precursor structure 10 to be processed as discussed herein. Precursor structure 10 may be positioned over a substrate (not shown) including, e.g., one or more semiconductive materials. Precursor structure 10 can include, e.g., a first inter-metal dielectric (IMD) 20 positioned over a semiconductor substrate and/or other component, and can also include a barrier dielectric 30 positioned on and overlying first IMD 20. In some cases, precursor structure 10 can include one or more conductors 40 positioned within first IMD 20. Conductor(s) 40 may include, e.g., conductive wires, vias, etc., for providing electrical connections between two or more distinct elements of an integrated circuit (IC). Although not shown explicitly in the accompanying FIGS., conductor(s) 40 may be electrically coupled to one or more circuit elements positioned orthogonally (e.g., laterally adjacent into or out of the plane of the page) relative to the structures shown herein.

IMD 20 may be formed over the exposed surface(s) of underlying materials (e.g., semiconductive substrate materials, conductors, and/or non-conductive structures), e.g., by deposition or any other currently-known or later developed process of forming a material. Materials underlying IMD 20, e.g., device layers, barrier films, etc., are omitted from the accompanying FIGS. 1-8 to better illustrate the materials formed and processed according to embodiments of the present disclosure. IMD 20 may include one or more insulating materials, e.g., silicon nitride (SiN), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material, other low dielectric constant (<3.9) material, or layers thereof. Barrier dielectric 30 may include the same material composition of IMD 20 and/or may include different insulating materials. In an example, barrier dielectric 30 may include, e.g., one or more nitride insulators such as silicon nitride (SiN).

Embodiments of the present disclosure can include, e.g., forming an insulator 102 on barrier dielectric 30 of precursor structure 10. Insulator 102 can include one or more insulating substances operable to form IMD 20, or may include one or more different insulating materials. According to an example, insulator 102 can include one or more oxide compounds for providing electrical insulation. Insulator 102 may be formed on IMD 20, e.g., by deposition and/or any other currently-known or later developed process of forming a material on exposed surfaces of a structure. As used herein, the term "deposition" generally refers to any currently known or later developed technique appropriate for insulator 102 or other materials to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation. After being formed, insulator 102 may have a thickness of, e.g., up to approximately 0.15 micrometers (μm). In further embodiments, insulator 102 may have a thickness of between approximately 0.10 μm and approximately 0.20 μm.

Insulator 102 can be formed and/or processed to define the position of later-formed structures. A mask 104 may be formed on portions of insulator 102, while leaving others exposed. Mask 104 can include, e.g., one or more currently-known or later developed masking materials known in lithography for shielding underlying materials from being affected by processes (e.g., etching) which affect exposed components of a structure. Mask 104 can include, e.g., one or more dielectric materials such as an oxide-nitride stack with nitride materials in mask 104 being positioned over oxide materials of insulator 102. Portions of insulator 102 not covered by mask 104 can thereafter be removed (e.g., by etching as indicated by corresponding arrows in FIG. 1) to form at least a first trench 106a, and a second trench 106b laterally separated from first trench 106a. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow isolation trenches (SIT).

In any event, portions of insulator 102 not covered by mask 104 may be partially removed to form trenches, e.g., without exposing barrier dielectric 30 of precursor structure 10. First trench 106a may be formed to a depth of, e.g., up to approximately 0.10 micrometers (μm) from the upper surface of insulator 102. In further embodiments, first trench 106a may be formed to a depth of between approximately 0.10 μm and approximately 0.20 μm. Regardless of the number and location of trenches 106a, 106b, 106c, portions of insulator 102 may be removed without exposing barrier dielectric 30, e.g., by etching or otherwise removing exposed portions of insulator 102 with a material having a lower etch rate, and for a time period sufficient to form trenches 106a, 106b, 106c without exposing barrier dielectric 30.

As discussed elsewhere herein, first trench 106a can define a location for forming an alignment marker, while second trench 106b can define a location for forming a metal-insulator-metal (MIM) capacitor. The present disclosure can optionally include forming a third trench 106c laterally separated from both first trench 106a and second trench 106b. In some arrangements, second trench 106b can be positioned laterally between first and third trenches 106a, 106b. Third trench 106c can define, e.g., a location where a resistor component is formed by other processes discussed herein. Mask 104 can be removed in a conventional manner after trench(es) 106a, 106b, 106c are formed.

Figure 2:
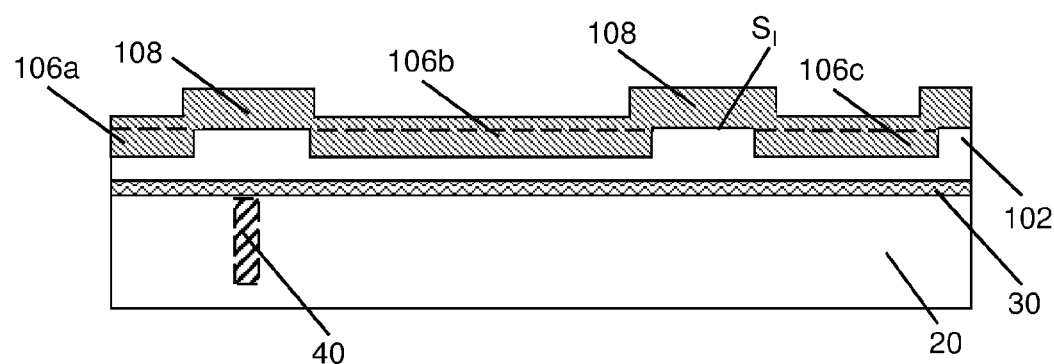
FIG. 2 shows a cross-sectional view of processes of a method according to embodiments of the disclosure.

Turning to FIG. 2, embodiments of the present disclosure can include processes for filling trench(es) 106a, 106b, 106c with materials to form at least partially conductive elements in a resulting IC structure. As shown, a refractory metal film 108 may be formed on an upper surface $S_I$ of insulator 102, and within trench(es) 106a, 106b, 106c. Refractory metal film 108 can be formed by way of any currently-known or later developed process of forming a material, and in particular may be formed to fill trench(es) 106a, 106b, 106c of insulator 102. Refractory metal film 108 may include one or more refractory metals therein, and in an example may include, e.g., ruthenium (Ru), tantalum (Ta), titanium (Ti), tungsten (W), iridium (Jr), rhodium (Rh) and platinum (Pt), etc. Mixtures and/or compounds of such metals may also be employed. For instance, refractory metal film 108 may include titanium nitride (TiN), tantalum nitride (TaN), and/or other refractory metal compounds or alloys which may have reduced conductivity relative to other conductive materials. However, refractory metal film 108 may have greater conductivity than IMD 20, barrier dielectric 30, insulator 102, and/or other insulative structures discussed herein.

Figure 3:
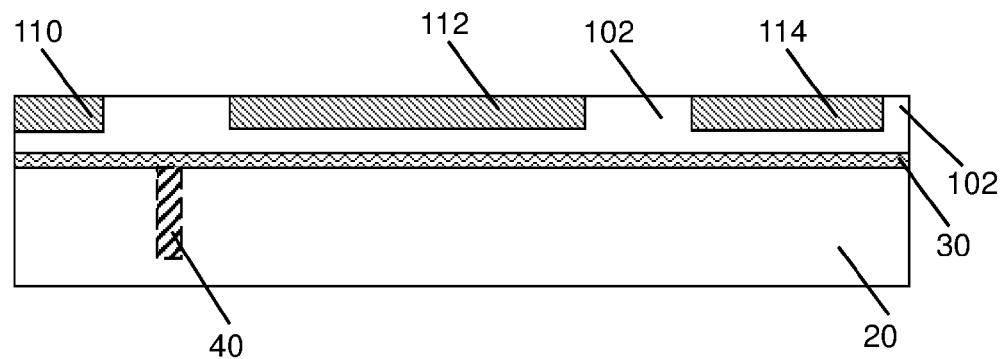
FIG. 3 shows a cross-sectional view of processes of a method according to embodiments of the disclosure.

Turning to FIG. 3, embodiments of the present disclosure include removing portions of refractory metal film 108 (FIG. 2) to form portions of an IC structure according to the present disclosure. A user can polish or otherwise remove portions of refractory metal film positioned outside trench (es) 106a, 106b, 106c and/or other regions by any process for planarizing or selectively removing portions of an exposed material. Polishing generally refers to any process applied to either reduce roughness of a component's surface or to remove excess material from the surface, e.g., using chemically reactive slurry or other currently-known or later developed reactive materials. Chemical mechanical planarization (CMP), in particular, provides a method of removing layers of solid by chemical-mechanical polishing carried out for the purpose of surface planarization and definition of a metal interconnect pattern and/or other connecting element.

As shown, such processing of refractory metal film 108 can yield laterally separated elements on insulator 102 positioned within respective trench(es) 106a (FIGS. 1-2), 106b (FIGS. 1-2), 106c (FIGS. 1-2) discussed herein. In particular, an alignment marker 110 can fill first trench 106a and may include the same material composition as refractory metal film 108. A first metal-insulator-metal (MIM) electrode 112 can fill second trench 106b, and may also include the material composition of refractory metal film 108. Where applicable, a resistor metal 114 can fill third trench 106c and can exhibit the material composition of alignment marker 110 and/or first MIM electrode 112. In photolithography, an "alignment marker" or "alignment mark" refers to a specially configured mark put on a mask or other structure to provide precise alignment of the mask or structure with corresponding patterns on a wafer. "Alignment" refers to the process of positioning a mask or other component in a lithographic process, relative to a wafer before exposing one or more photoresist materials for manufacturing portions of a product. An "aligner" or similar tool may be implemented to allow adequate positioning of the mask or other structure in a lithographic process relative to the wafer, before exposing the photoresist material. Alignment marker 110 can differ from conventional elements in an IC structure with MIM components (e.g., capacitors, diodes, resistors, etc.) by being formed directly on insulator 102 where at least some functional part of the MIM component(s) are also fabricated. By comparison, conventional IC structures with MIM components therein will include a separate masking layer where alignment elements are formed. It is understood that alignment marker 110, first MIM electrode 112, and/or resistor metal 114 can be formed from different materials and pursuant to other currently-known or later developed processes for filling a trench with a material. Where alignment marker 110, first MIM electrode 112, and/or resistor metal 114 are formed together, each may include the material composition of refractory metal film 108.

Figure 4:
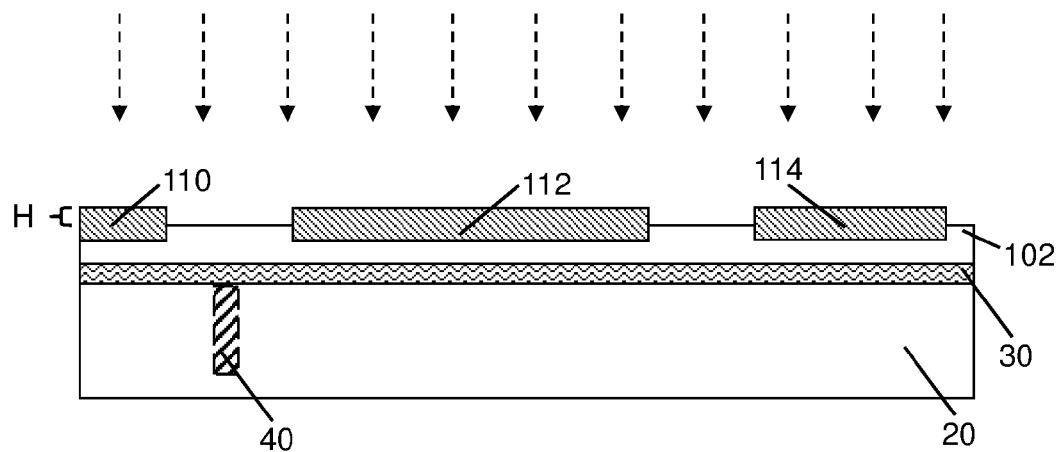
FIG. 4 shows a cross-sectional view of processes of a method according to embodiments of the disclosure.

Referring to FIG. 4, embodiments of the disclosure can include recessing insulator 102 relative to alignment marker 110, first MIM electrode 112, and/or resistor metal 114 without exposing barrier dielectric 30 beneath insulator 102. One or more forms of etching (illustrated by phantom arrows in FIG. 4) can be used to recess insulator 102. Insulator 102 can be recessed to increase the exposed surface area of alignment marker 110, first MIM electrode 112, and/or resistor metal 114. Insulator 102 may be recessed relative to alignment marker 110, first MIM electrode 112, and/or resistor metal 114, e.g., by applying a selective etch. A selective etch may remove portions of insulator 102 without significantly affecting the refractory metal materials in other exposed elements. Due to the material composition of insulator 102 being different from alignment marker 110, first MIM electrode 112, and/or resistor metal 114, insulator 102 can be etched at a substantially higher rate by being treated with etchants selective to insulating materials, e.g., fluorine-based gas etchants which react selectively with oxide insulators. In other embodiments, a lithographic mask may be used to cover alignment marker 110, first MIM electrode 112, and/or resistor metal 114 to protect these elements from being etched with insulator 102. Regardless, a negligible amount of material may be removed from alignment marker 110, MIM electrode 112, and/or resistor metal 114 when insulator 102 is recessed. Recessing insulator 102 as described herein can yield a height differential H between insulator 102 and alignment marker 110, first MIM electrode 112, and/or resistor metal 114, e.g., of up to approximately one-hundred Angstroms (Å). In further embodiments, height differential H may be between approximately 100 Å and approximately 250 Å.

Figure 5:
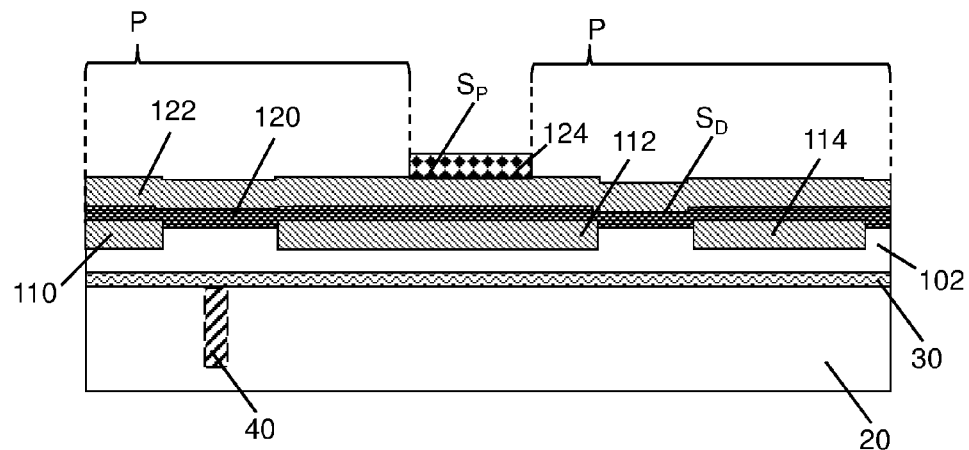
FIG. 5 shows a cross-sectional view of processes of a method according to embodiments of the disclosure.

Turning to FIG. 5, embodiments of the present disclosure include forming a MIM dielectric layer 120 on, e.g., directly on and in contact with, insulator 102 such that MIM dielectric layer 120 contacts and overlies alignment marker 110, first MIM electrode 112, and/or resistor metal 114. MIM dielectric layer 120 may be formed, e.g., by deposition and/or any other currently-known or later developed process for forming a material on exposed surfaces of a structure. MIM dielectric layer 120 may include any currently-known or later developed electrically insulative operable for use in a capacitor element of a circuit structure, e.g., silicon nitride (SiN), variants thereof, and/or other materials including the same. MIM dielectric layer 120 may include one or more of the insulating materials making up, e.g., ILD 20 and/or insulator 102, or may include other insulating materials. After MIM dielectric layer 120 is formed, alignment marker 110, first MIM electrode 112, and/or resistor metal 114 may each be positioned directly between insulator 102 and MIM dielectric layer 120 without being in contact with other electrically insulative and/or conductive IC elements.

Embodiments of the present disclosure can include forming another MIM electrode to yield a MIM capacitor structure, as discussed herein. The disclosure can include forming a second refractory metal film 122 on an upper surface $S_D$ of MIM dielectric layer 120. Second refractory metal film 122 may include one or more of the example refractory materials described herein relative to first MIM electrode 112, and more specifically may include the same material composition as first MIM electrode 112. Upon being formed, second refractory metal film 122 may contact and overlie each of insulator 102, alignment marker 110, first MIM electrode 112, and/or resistor metal 114. As illustrated, MIM dielectric layer 120 can be positioned directly between second refractory metal film 122 and each of alignment marker 110, first MIM electrode 112, and/or resistor metal 114. Methods according to the disclosure can thereafter include forming a mask 124 on a portion Sp of second refractory metal film 122 positioned over first MIM electrode 112. Mask 124 can include one or more of the example material compositions applicable to mask 104 described elsewhere herein, and/or may include any other currently-known or later developed masking material.

Figure 6:
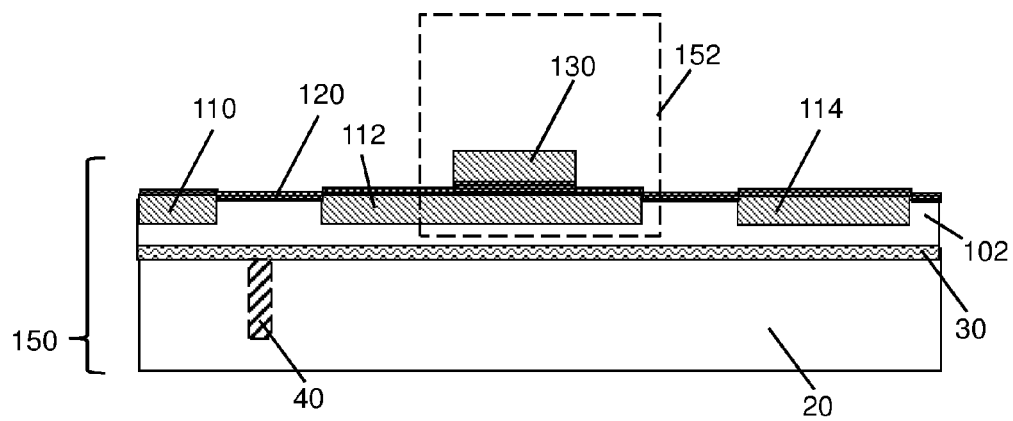
FIG. 6 shows a cross-sectional view of processes of a method and an IC structure according to embodiments of the disclosure.

Referring to FIGS. 5 and 6 together, the present disclosure can include removing portions P of second refractory metal film 122 positioned laterally outside mask 124, e.g., by way of etching and/or other currently-known or later developed processes for removing materials not covered by mask 124. As shown in FIG. 6, a portion of MIM dielectric layer 120 underlying second refractory metal 122 can be removed along with portions P of second refractory metal film 122. Removing portions P of second refractory metal film 122 can yield a second MIM electrode 130 including, e.g., remaining materials from second refractory metal film 122. After portions P of second refractory metal film 122 are removed, mask 124 can also be removed by any currently-known or later developed process for removing a mask. Second MIM electrode 130 can overlie first MIM electrode 112 with MIM dielectric layer 120 being positioned therebetween. Further, at least a portion of MIM dielectric layer 120 can remain positioned over alignment marker 110, first MIM electrode 112, and/or resistor metal 114.

The various processing embodiments discussed herein can yield an IC structure 150 according to the disclosure. IC structure 150 can include, e.g., first IMD 20 with barrier dielectric 30 positioned on first IMD 20. Insulator 102 can be positioned on barrier dielectric 30, and may include trench(es) 106a, 106b, 106c (FIG. 1) filled with alignment marker 110, first MIM electrode 112, and/or resistor metal 114, respectively. In structure 150, MIM dielectric layer 120 can be positioned on at least insulator 102, alignment marker 110, and first MIM electrode 112, as well as resistor metal 114 where applicable. Second MIM electrode 130 can be positioned on MIM dielectric layer 120 to overlie only part of first MIM electrode 112, e.g., as defined by mask 124 during fabrication. Together, first MIM electrode 112, MIM dielectric layer 120, and second MIM electrode 130 can define a MIM capacitor structure 152 for placement, e.g., at an interface between two IMD materials as discussed herein. As shown, IC structure 150 can also include resistor wire 114 positioned within third trench 106c (FIG. 1) of insulator 102 and beneath MIM dielectric layer 120. As also discussed herein, insulator 102 can be recessed relative to alignment marker 110, first MIM electrode 112, and resistor wire 114. Resistor wire 114, in addition, can be laterally separated from alignment marker 110 and first MIM electrode 112, such that first MIM electrode 112 is positioned laterally between alignment marker 11 and resistor wire 114.

Figure 7:
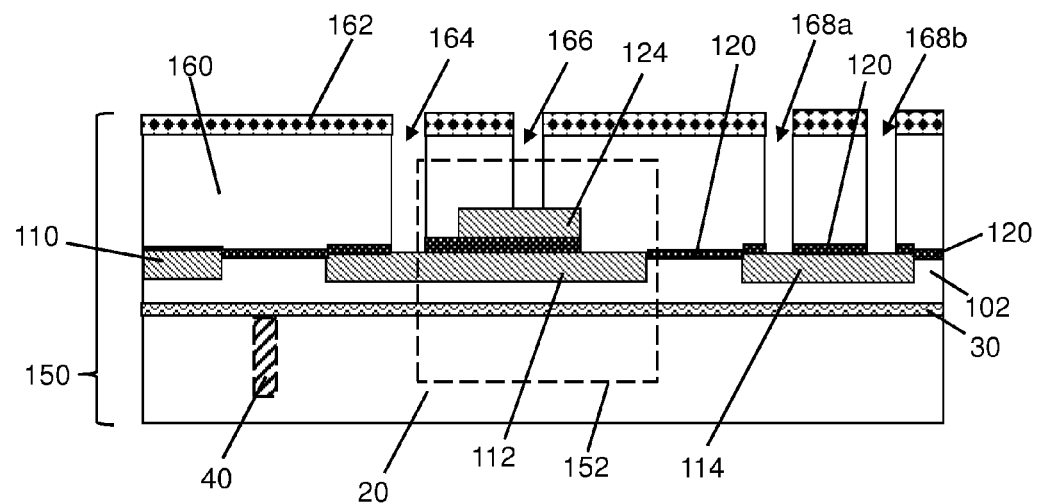
FIG. 7 shows a cross-sectional view of further processes of a method according to embodiments of the disclosure.

Turning to FIG. 7, the present disclosure includes forming a second IMD 160 over MIM dielectric layer 120 and second MIM electrode 124. Second IMD 160 may include the same material composition as first IMD 20, or may include any other currently-known or later developed insulating material. Thereafter, a mask 162 can be formed on second IMD 160 to target portions thereof for removal as described herein. Portions of second IMD 160 can be removed, e.g., to form conductive structures for connecting other IC elements to MIM capacitor structure 152. As shown, a portion of second IMD 160, and corresponding portion of MIM dielectric layer 120, overlying first MIM electrode 112 can be removed (e.g., by etching and/or other removal techniques) to form a first contact opening 164 within second IMD 160. Similarly, a portion of second IMD 160 overlying second MIM electrode 125 can be removed to form a second contact opening 166 within second IMD 160. Where applicable, a pair of contact openings 168*a*, 168*b* can be formed in second IMD 160 to expose respective portions of resistor wire 114.

Figure 8:
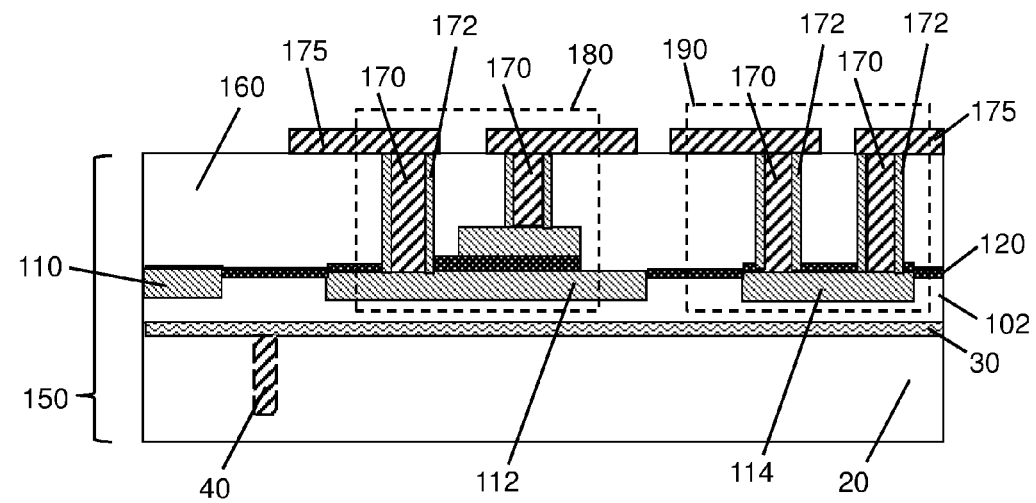
FIG. 8 shows a cross-sectional view of further processes of a method and an IC structure according to embodiments of the disclosure.

Referring to FIGS. 7 and 8 together, further processes according to the disclosure can include forming a conductive metal 170 within openings 164, 166, 168*a*, 168*b* to yield conductive contacts extending through second IMD 160. Conductive metal 170 can include any currently-known or later developed substance for transmitting an electric current, e.g., a conducting metallic compound material (e.g., tungsten (W), aluminum (Al), copper (Cu), etc.), or any suitable combination, alloy, etc., of these materials. In addition, a set of refractory metal liners 172 can be formed on sidewalls of each opening 164, 166, 168*a*, 168*b*, before conductive metal 170 is formed therein. Conductive metal 170 formed in first opening 164 may form a first contact to first MIM electrode 112, conductive metal 170 formed in second opening 166 may form a second contact to second MIM electrode 124, while conductive metal 170 formed in openings 168*a*, 168*b* may form a contact to resistor wire 114. Refractory metal liners 172 may include one or more materials described elsewhere herein relative to first and second refractory metal films 108 (FIG. 2), 122 (FIG. 5), e.g., tantalum nitride (TaN), tantalum (Ta), ruthenium (Ru) titanium (Ti), tungsten (W), iridium (Jr), rhodium (Rh) and platinum (Pt), etc., or mixtures of thereof. Refractory metal liners 172 may reduce electromigration and/or other structural and performance losses during operation. A set of metal wires 175 can thereafter be formed on conductive metal 170 to connect different circuit elements to MIM electrodes 112, 124, resistor wire 114, etc.

As shown in FIG. 8, IC structure 150 can include distinct IC components after being processed according to the present disclosure. A MIM capacitor 180 can include conductive metal 170 connecting metal wires 175 to first and second MIM electrodes 112, 124. A resistor structure 190, adjacent to MIM capacitor 180, can include conductive metal 170 connecting metal wires 175 to resistor metal 114. As shown, first MIM electrode 112 of MIM capacitor 180 can be positioned within insulator 102, and laterally separated from alignment marker 110 by insulator 102. Similarly, resistor wire 114 of resistor structure 190 can be positioned within insulator 102, and laterally separated from alignment marker 110 by insulator 102.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    providing a precursor structure including:
        a first inter-metal dielectric (IMD);
        a barrier dielectric positioned on the first IMD;
    forming an insulator on the barrier dielectric of the precursor structure, wherein an upper surface of the insulator includes a first trench and a second trench laterally separated from the first trench;
    forming an alignment marker over the precursor structure by filling the first trench with a first refractory metal film;
    forming a first metal-insulator-metal (MIM) electrode by filling the second trench with the first refractory metal film;
    recessing the insulator without exposing an upper surface of the barrier dielectric;
    forming a MIM dielectric layer on the insulator; and
    forming a second MIM electrode on the MIM dielectric layer, such that the second MIM electrode overlies a portion of the first MIM electrode.

2. The method of claim 1, wherein forming the second MIM electrode on the MIM dielectric layer further includes:
   forming a second refractory metal film on an upper surface of the MIM dielectric layer;
   forming a mask on a portion of the second refractory metal film positioned over the portion of the first MIM electrode; and
   removing a portion of the second refractory metal film positioned laterally outside the mask.

3. The method of claim 1, wherein the first IMD of the precursor structure further includes a conductor embedded therein, and wherein the conductor of the first IMD is positioned laterally between the first and second trenches after forming the insulator.

4. The method of claim 1, wherein the MIM dielectric layer includes silicon nitride (SiN).

5. The method of claim 1, wherein the recessing includes selectively etching the insulator to a depth approximately one hundred Angstroms (Å), relative to an upper surface of the alignment marker, before forming the MIM dielectric layer.

6. The method of claim 1, wherein a depth of the first trench is approximately 0.10 micrometers (μm) from the upper surface of the insulator.

7. The method of claim 6, wherein the insulator comprises an oxide layer having a thickness of approximately 0.15 micrometers (μm).

8. The method of claim 1, further comprising:
   forming a second IMD over the second MIM electrode and the MIM dielectric layer;
   forming a first contact opening within the second IMD and the MIM dielectric layer to expose a portion of the first MIM electrode not underlying the second MIM electrode;
   forming a second contact opening within the second IMD to expose the second MIM electrode; and
   forming a conductive metal within the first and second contact openings.

9. The method of claim 1, wherein the first MIM electrode, the MIM dielectric layer, and the second MIM electrode define a MIM capacitor structure.

10. A method of forming an integrated circuit (IC) structure, the method comprising:
    providing a precursor structure including:
       a first inter-metal dielectric (IMD),
       a barrier dielectric positioned on the first IMD;
    forming an insulator on the barrier dielectric of the precursor structure, wherein an upper surface of the insulator includes a first trench, a second trench laterally separated from the first trench, and a third trench laterally separated from the first and second trenches, wherein the second trench is positioned laterally between the first and third trenches;
    forming a first refractory metal film on the insulator and within each of the first trench, the second trench, and the third trench;
    planarizing the first refractory metal film to expose an upper surface of the insulator, such that a remainder of the first refractory metal film forms an alignment marker within the first trench, a first metal-insulator-metal (MIM) electrode within the second trench, and a resistor wire within the third trench;
    recessing the insulator without exposing an upper surface of the barrier dielectric;
    forming a MIM dielectric layer on the insulator; and
    forming a second MIM electrode on the MIM dielectric layer, such that the second MIM electrode overlies a portion of the first MIM electrode.

11. The method of claim 10, wherein forming the second MIM electrode on the MIM dielectric layer further includes:
    forming a second refractory metal film on an upper surface of the MIM dielectric layer;
    forming a mask on a portion of the second refractory metal film positioned over the portion of the first MIM electrode; and
    removing a portion of the second refractory metal film positioned laterally outside the mask.

12. The method of claim 11, further comprising:
    forming a second IMD over the second MIM electrode and the MIM dielectric layer;
    forming a first contact opening within the second IMD and the MIM dielectric layer to expose a portion of the first MIM electrode not underlying the second MIM electrode;
    forming a second contact opening within the second IMD to expose the second MIM electrode; and
    forming a conductive metal within the first and second contact openings.

13. The method of claim 11, further comprising:
    forming a second IMD over the second MIM electrode and the MIM dielectric layer;
    forming a pair of contact openings within the second IMD and the MIM dielectric layer to expose respective portions of the resistor wire; and
    forming a conductive metal within the pair of contact openings.

14. The method of claim 11, wherein the MIM dielectric layer includes silicon nitride (SiN).

15. The method of claim 11, wherein the first MIM electrode, the MIM dielectric layer, and the second MIM electrode define a MIM capacitor structure.

* * * * *